(12) United States Patent
Liang et al.

(10) Patent No.: US 8,662,317 B2
(45) Date of Patent: Mar. 4, 2014

(54) SERVER CABINET

(75) Inventors: An-Gang Liang, Shenzhen (CN); Zheng-Heng Sun, New Taipei (TW)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 64 days.

(21) Appl. No.: 13/485,947

(22) Filed: Jun. 1, 2012

(65) Prior Publication Data

US 2013/0285521 A1 Oct. 31, 2013

(30) Foreign Application Priority Data

Apr. 25, 2012 (CN) .......................... 2012 1 0123704

(51) Int. Cl.
*A47F 7/00* (2006.01)

(52) U.S. Cl.
USPC .............................. 211/26; 211/189; 361/829

(58) Field of Classification Search
USPC ............. 211/26, 26.2, 189; 312/223.1, 223.2, 312/265.4; 361/829, 832, 724, 729; 248/27.1, 27.3

See application file for complete search history.

(56) References Cited

U.S. PATENT DOCUMENTS

| 3,710,972 | A | * | 1/1973 | Barry | 220/3.6 |
| 4,577,818 | A | * | 3/1986 | Clarisse | 248/27.3 |
| 6,099,098 | A | * | 8/2000 | Leong | 312/333 |
| 6,220,456 | B1 | * | 4/2001 | Jensen et al. | 211/26 |
| 6,398,041 | B1 | * | 6/2002 | Abbott | 211/26 |

* cited by examiner

*Primary Examiner* — Korie H Chan
(74) *Attorney, Agent, or Firm* — Altis Law Group, Inc.

(57) ABSTRACT

A server cabinet includes a housing, a switch, and two fastening members. The housing includes two posts. The switch includes two opposite sidewalls. Each fastening member includes a fastening plate with a first end of the fastening plate fastened to a corresponding post, a connection plate slantingly extending from the fastening plate, and two mounting plates respectively extending from a second end of the fastening plate and a distal end of the connection plate and perpendicular to the fastening plate. The mounting plates of each fastening member are fastened to a corresponding sidewall.

7 Claims, 6 Drawing Sheets

SERVER CABINET

BACKGROUND

1. Technical Field

The present disclosure relates to a server cabinet.

2. Description of Related Art

Switches are provided for exchanging information in a server cabinet. Front ends of the switches are generally screwed to the cabinet. In transport, rear ends of some long switches shake easily, thus, the screws in the front ends of the switches may be loosened.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
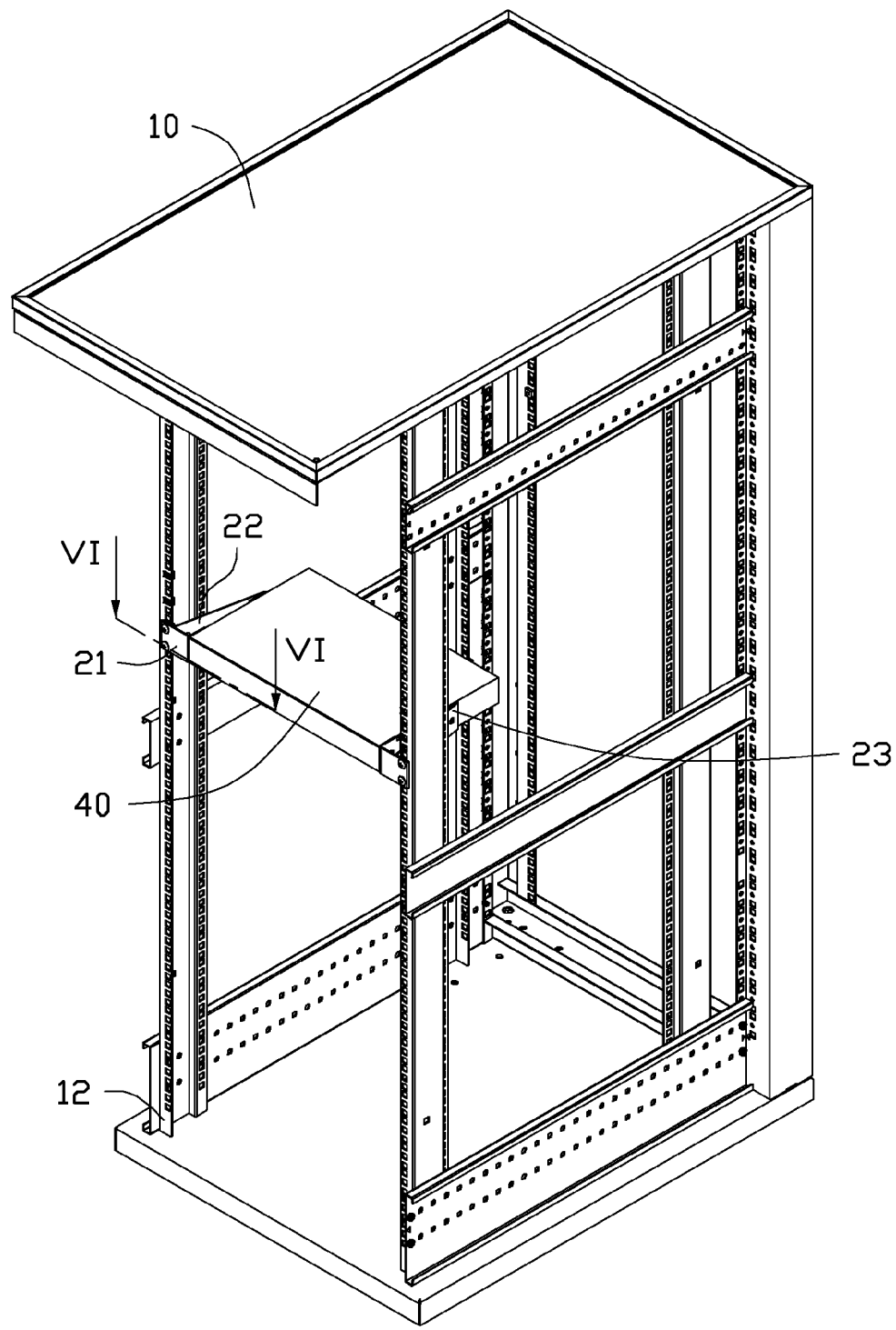
FIG. 1 is an assembled, isometric view of an exemplary embodiment of a server cabinet, wherein the cabinet includes a switch, two fastening members, and four engaging members.
Figure 2:
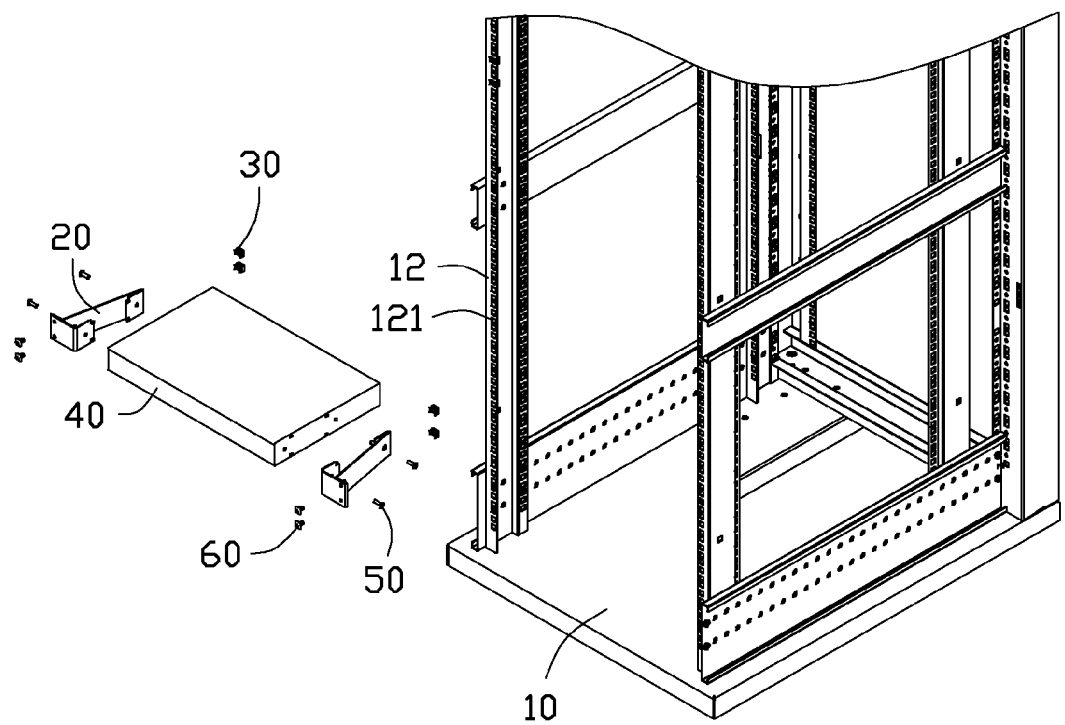
FIG. 2 is a partially exploded, isometric view of FIG. 1.

FIGS. 1 and 2 show an exemplary embodiment of a server cabinet including a housing 10, two fastening members 20, four engaging members 30, and a switch 40 mounted in the housing 10.

Two posts 12 are formed on opposite sides of a front end of the housing 10. A plurality of rectangular openings 121 is longitudinally defined in each post 12.

Figure 3:
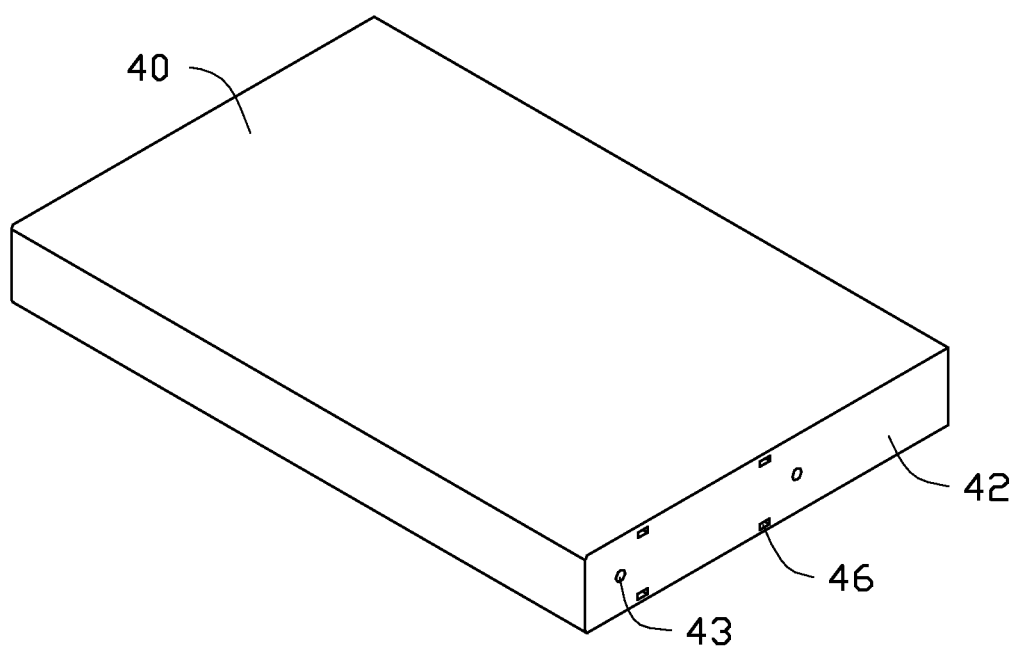
FIG. 3 is an enlarged view of the switch of FIG. 2.

FIG. 3 shows the switch 40 including two opposite sidewalls 42. Two mounting holes 43 are defined in each sidewall 42, respectively in a front end and a rear portion of the sidewall 42. Four hooking slots 46 are defined in each sidewall 42, between the mounting holes 43. Two of the hooking slots 46 are adjacent to a top of the switch 40, the other two hooking slots 46 are adjacent to a bottom of the switch 40.

Figure 4:
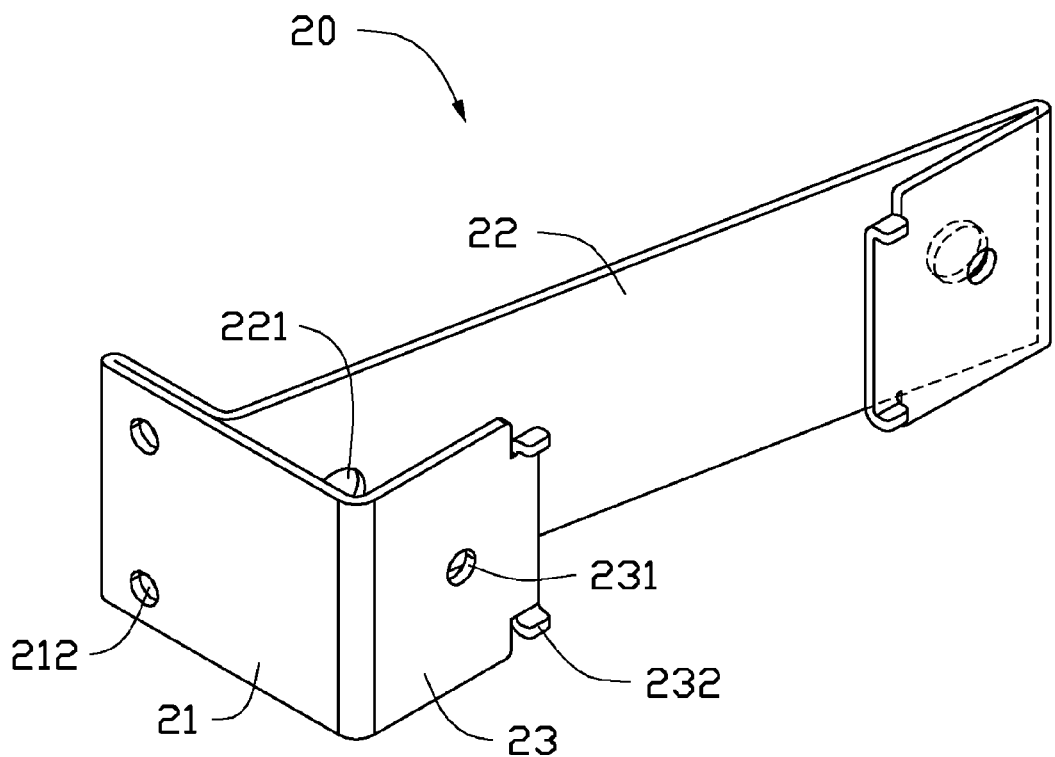
FIG. 4 is an enlarged view of one of the fastening members of FIG. 2.

FIG. 4 shows each fastening member 20 including a fastening plate 21, and a connection plate 22 reversely extending toward a middle of the fastening plate 21 from a first end of the fastening plate 21 firstly and then slantingly extending toward a second end of the fastening plate 21 opposite to the first end of the fastening plate 21. Two mounting plates 23 extend toward each other respectively from the second end of the fastening plate 21 and a distal end of the connection plate 22 away from the fastening plate 21, perpendicular to the fastening plate 21. Two through holes 212 are defined in the fastening plate 21, adjacent to the first end of the fastening plate 21 and extending through the connection plate 22 adjoining the fastening plate 21. A through hole 231 is defined in each mounting plate 23. Two latches 232 substantially perpendicularly extend from a distal side of each mounting plate 23 adjacent to the other mounting plate 23, respectively near a top and a bottom of the mounting plate 23. Two through holes 221 are defined in the connection plate 22, aligning with the corresponding through holes 231.

Figure 5:
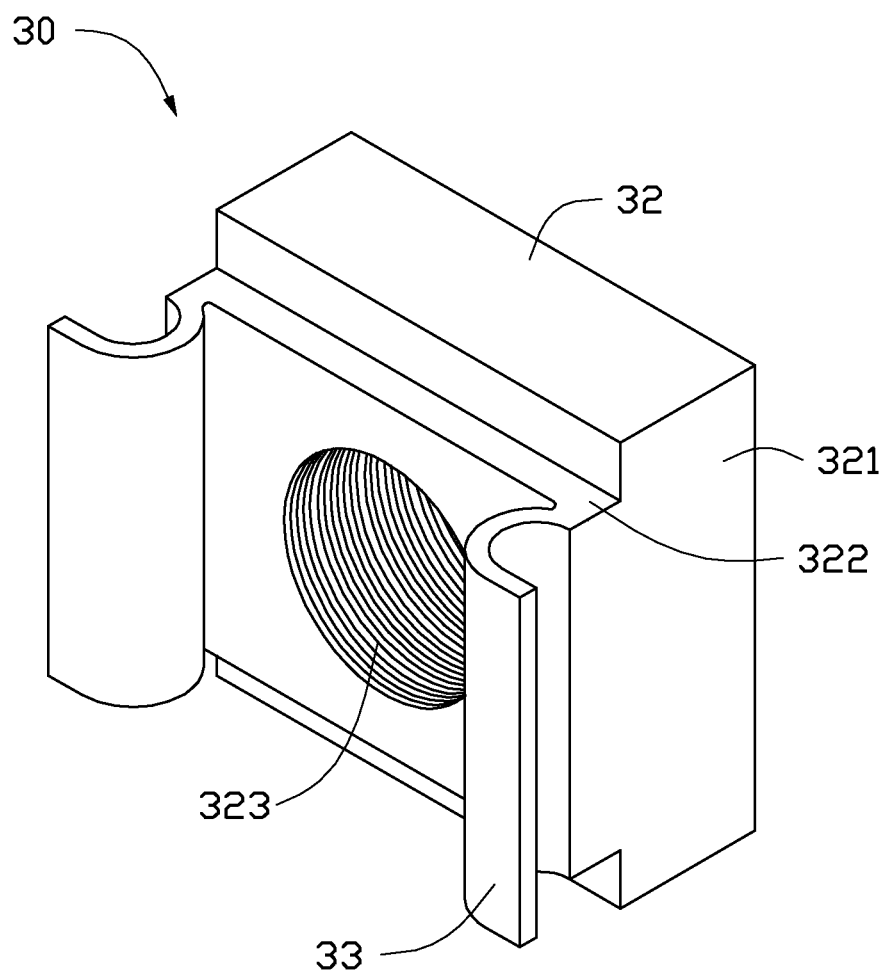
FIG. 5 is an enlarged view of one of the engaging members of FIG. 2.

FIG. 5 shows each engaging member 30 including a substantially T-shaped block 32, and two substantially C-shaped clamping portions 33. The block 32 includes a base block 321 and an extension block 322 perpendicularly extending from a front side of the base block 321. The clamping portions 33 extend from opposite ends of a front side of the extension block 322, opposite to each other. A fastening hole 323 is defined in the front side of the extension block 322.

Figure 6:
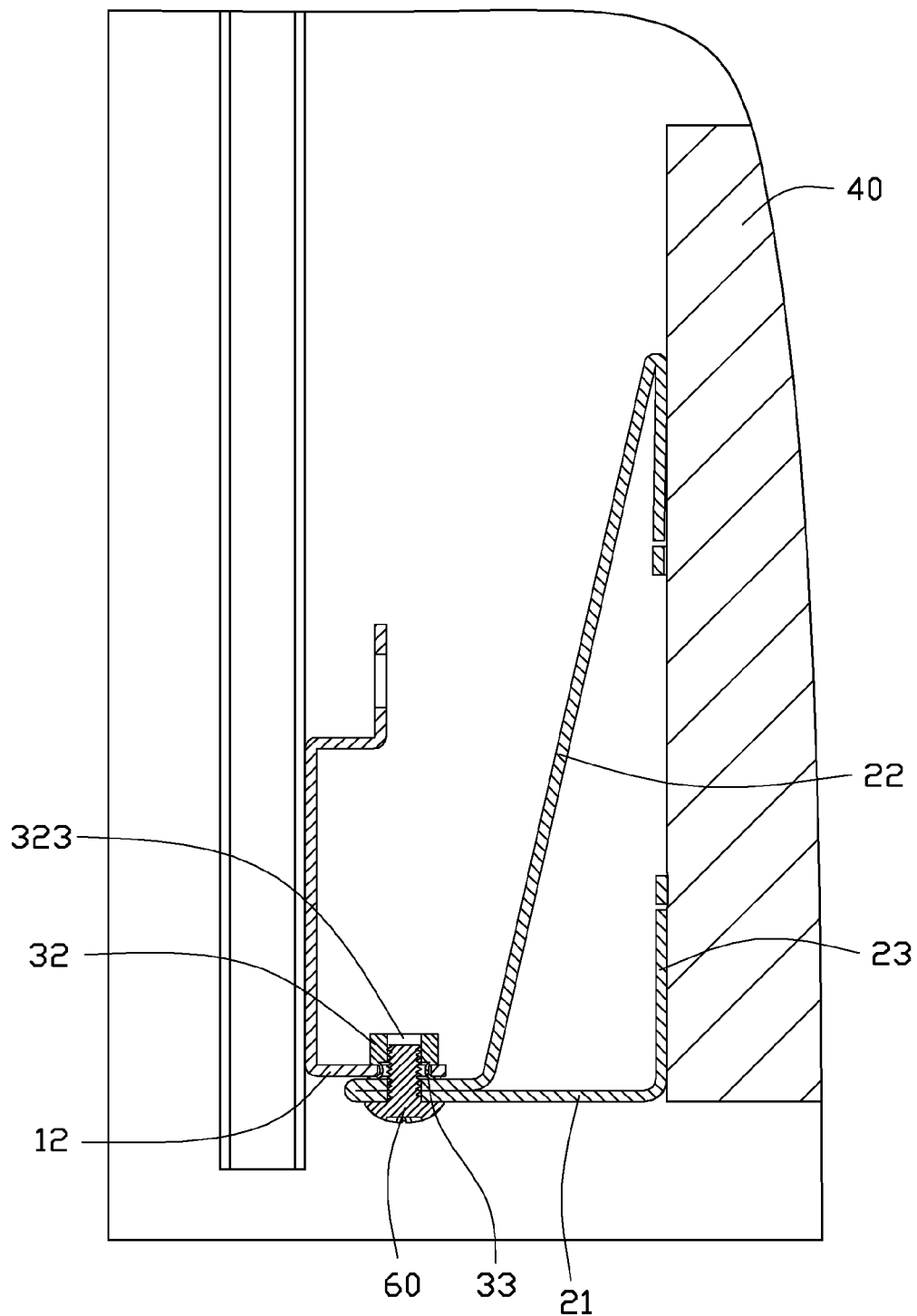
FIG. 6 is a sectional view taken along the line of VI-VI of FIG. 1.

FIGS. 1 and 6 show in assembly, the latches 232 of the fastening members 20 engage in the corresponding hooking slots 46, with the fastening plates 21 in the front. The mounting plates 23 abut against the sidewalls 42. The through holes 231 align with the corresponding mounting holes 43. Four fasteners 50, such as four bolts, orderly extend through the corresponding through holes 221 and the corresponding through holes 231, and then engage in the corresponding mounting holes 43. Therefore, the fastening members 20 are fastened to the switch 40.

Two of the engaging members 30 are fastened to two near openings 121 of one of the posts 12, the other two engaging members 30 are fastened to two near openings 121 of the other post 12. Each engaging member 30 is placed behind the corresponding post 12, aligning with the corresponding opening 121. The engaging member 30 is manipulated toward the opening 121. The clamping portions 33 of the engaging member 30 are deformed toward each other after abutting against the post 12. The clamping portions 33 extend through the opening 121, and restore. The clamping portions 33 clamp the post 12. Therefore, the engaging members 30 are fastened to the posts 12.

The through holes 212 of the fastening members 20 align with the through holes 121 mounting to the engaging members 30. Four screws 60 extend through the corresponding through holes 212 and the corresponding through holes 121, and then engage in the corresponding fastening holes 323. Therefore, the switch 40 is fastened to the posts 12.

The mounting plates 23 of the fastening members 20 fasten the front end and the rear portion of the switch 40 with a large contacting area, so that the switch 40 is fastened firmly and not easily shaken.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A server cabinet, comprising:
a housing comprising two posts;
a switch comprising two opposite sidewalls; and
two fastening members respectively fastened to the sidewalls, each fastening member comprising a fastening plate with a first end fastened to a corresponding one of the two posts, a connection plate slantingly extending from the fastening plate, and two mounting plates respectively extending from a second end of the fastening plate and a distal end of the connection plate, the mounting plates perpendicular to the fastening plate and fastened to the corresponding sidewall.

2. The server cabinet of claim 1, wherein two mounting holes are respectively defined in a front end and a rear portion of each sidewall, a first through hole is defined in each mounting plate, four fasteners extend through the corresponding first through holes and engage in the corresponding mounting holes.

3. The server cabinet of claim 2, wherein a plurality of hooking slots is defined in each sidewall, a plurality of latch extends from the mounting plates to engage in the corresponding hooking slots.

4. The server cabinet of claim 2, wherein the connection plate is reversely extended toward a middle of the fastening plate from the first end of the fastening plate firstly and then slantingly extends toward the second end of the fastening plate.

5. The server cabinet of claim 1, further comprising two engaging members, wherein an opening is defined in each post, each engaging member comprises a block behind a corresponding opening, and two clamping portions extending from opposite ends of a front side of the block to extend through the opening and clamp the post.

6. The server cabinet of claim 5, wherein the clamping portions are substantially C-shaped, opposite to each other.

7. The server cabinet of claim 5, wherein a fastening hole is defined in each block, a second through hole is defined in the first end of each fastening plate, two screws extend through the corresponding second through holes and the corresponding openings, and then engage in the corresponding fastening holes.

* * * * *